(12) United States Patent
Chen et al.

(10) Patent No.: US 9,133,018 B2
(45) Date of Patent: Sep. 15, 2015

(54) STRUCTURE AND FABRICATION METHOD OF A SENSING DEVICE

(75) Inventors: Lung-Tai Chen, Kaohsiung (TW); Yu-Wen Hsu, Tainan (TW); Sheah Chen, Keelung (TW); Jing-Yuan Lin, Taipei (TW); Li-Chi Pan, Hsinchu (TW); Tzong-Che Ho, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 1259 days.

(21) Appl. No.: 12/572,277

(22) Filed: Oct. 2, 2009

(65) Prior Publication Data

US 2011/0018075 A1    Jan. 27, 2011

(30) Foreign Application Priority Data

Jul. 23, 2009   (TW) ................................. 98124843 A

(51) Int. Cl.
*B81B 7/00* (2006.01)

(52) U.S. Cl.
CPC .......... *B81B 7/007* (2013.01); *B81B 2201/0292* (2013.01); *B81B 2207/093* (2013.01)

(58) Field of Classification Search
CPC ................................................ B81B 2207/093
USPC ............ 438/107, 51, 456, 690; 257/415, 678, 257/E29.324, E23.18
See application file for complete search history.

(56) References Cited

U.S. PATENT DOCUMENTS

| | | | |
|---|---|---|---|
| 4,625,561 A * | 12/1986 | Mikkor | 73/724 |
| 4,780,572 A | 10/1988 | Kondo et al. | |
| 5,610,431 A * | 3/1997 | Martin | 257/415 |
| 5,987,989 A * | 11/1999 | Yamamoto et al. | 73/514.24 |
| 6,380,616 B1 * | 4/2002 | Tutsch et al. | 257/686 |
| 6,504,096 B2 * | 1/2003 | Okubora | 174/521 |
| 6,512,300 B2 * | 1/2003 | Cheever et al. | 257/777 |
| 6,578,427 B1 * | 6/2003 | Hegner | 73/724 |
| 6,743,656 B2 * | 6/2004 | Orcutt et al. | 438/66 |
| 6,750,521 B1 * | 6/2004 | Chilcott et al. | 257/414 |
| 6,777,263 B1 * | 8/2004 | Gan et al. | 438/106 |
| 6,787,897 B2 * | 9/2004 | Geefay et al. | 257/704 |
| 6,921,972 B1 * | 7/2005 | Hashemi | 257/707 |

(Continued)

FOREIGN PATENT DOCUMENTS

TW       200844036 A    11/2008

OTHER PUBLICATIONS

A Low Temperature, Hermetic Wafer Level Packaging Method for RF MEMS Switch Woonbae Kim, Qian Wang, Junsik Hwang, Moonchul Lee, Kyudong Jung, SukJin Ham, Changyoul Moon 2005 Electronic Components and Technology Conference, p. 1103-p. 1108.

(Continued)

*Primary Examiner* — Yu-Hsi D Sun
*Assistant Examiner* — Ankush Singal
(74) *Attorney, Agent, or Firm* — Lin & Associates IP, Inc.

(57) ABSTRACT

A sensing device comprises a substrate having an upper surface, a sensor member, at least an external conductive wire, and a standing-ring member. The sensor member, the external conductive wire and the stand-ring member are on the upper surface. The sensor member is located at the central area on the upper surface, and the standing-ring member surrounds the sensor member. The standing-ring member and the sensor member are electrically connected through the at least an external conductive wire.

14 Claims, 20 Drawing Sheets

(56) References Cited

U.S. PATENT DOCUMENTS

| | | | |
|---|---|---|---|
| 6,939,784 B2 * | 9/2005 | Chen et al. | 438/456 |
| 6,965,107 B2 * | 11/2005 | Komobuchi et al. | 250/338.1 |
| 7,047,815 B2 * | 5/2006 | Sashinami et al. | 73/718 |
| 7,061,099 B2 * | 6/2006 | Lu et al. | 257/704 |
| 7,135,749 B2 * | 11/2006 | Sakai et al. | 257/419 |
| 7,138,293 B2 * | 11/2006 | Ouellet et al. | 438/106 |
| 7,230,512 B1 * | 6/2007 | Carpenter et al. | 333/193 |
| 7,275,424 B2 * | 10/2007 | Felton et al. | 73/104 |
| 7,294,920 B2 * | 11/2007 | Chen et al. | 257/698 |
| 7,334,476 B2 * | 2/2008 | Ichikawa | 73/514.33 |
| 7,360,293 B2 * | 4/2008 | Sato et al. | 29/595 |
| 7,374,972 B2 * | 5/2008 | Kwon et al. | 438/113 |
| 7,378,294 B2 * | 5/2008 | Ding et al. | 438/51 |
| 7,446,307 B2 * | 11/2008 | Huang et al. | 250/239 |
| 7,449,366 B2 * | 11/2008 | Lee et al. | 438/115 |
| 7,482,193 B2 * | 1/2009 | DCamp et al. | 438/51 |
| 7,508,286 B2 * | 3/2009 | Ruby et al. | 333/189 |
| 7,579,685 B2 * | 8/2009 | Lee et al. | 257/704 |
| 7,595,220 B2 * | 9/2009 | Weng et al. | 438/106 |
| 7,622,782 B2 * | 11/2009 | Chu et al. | 257/415 |
| 7,642,611 B2 * | 1/2010 | Tsuji et al. | 257/414 |
| 7,696,004 B2 * | 4/2010 | Yuan et al. | 438/106 |
| 7,732,302 B2 * | 6/2010 | Yazdi | 438/456 |
| 7,750,462 B1 * | 7/2010 | Cohn et al. | 257/704 |
| 7,847,387 B2 * | 12/2010 | Kilger et al. | 257/686 |
| 7,875,942 B2 * | 1/2011 | Cortese et al. | 257/415 |
| 7,893,527 B2 * | 2/2011 | Shin et al. | 257/698 |
| 2002/0109137 A1 * | 8/2002 | Sato et al. | 257/48 |
| 2002/0117728 A1 * | 8/2002 | Brosnihhan et al. | 257/446 |
| 2002/0179986 A1 * | 12/2002 | Orcutt et al. | 257/417 |
| 2003/0094663 A1 * | 5/2003 | Sato et al. | 257/414 |
| 2003/0104651 A1 * | 6/2003 | Kim et al. | 438/106 |
| 2003/0214029 A1 * | 11/2003 | Tao et al. | 257/723 |
| 2004/0063325 A1 * | 4/2004 | Urano et al. | 438/692 |
| 2004/0067604 A1 * | 4/2004 | Ouellet et al. | 438/108 |
| 2004/0259325 A1 * | 12/2004 | Gan | 438/456 |
| 2005/0013533 A1 * | 1/2005 | Wiegele et al. | 385/18 |
| 2005/0023629 A1 * | 2/2005 | Ding et al. | 257/414 |
| 2005/0176179 A1 * | 8/2005 | Ikushima et al. | 438/125 |
| 2005/0194670 A1 * | 9/2005 | Kameyama et al. | 257/678 |
| 2005/0284229 A1 * | 12/2005 | Hiura et al. | 73/753 |
| 2006/0030070 A1 * | 2/2006 | Leu et al. | 438/106 |
| 2006/0115920 A1 * | 6/2006 | Urano et al. | 438/50 |
| 2006/0141650 A1 * | 6/2006 | Kim et al. | 438/44 |
| 2006/0199297 A1 * | 9/2006 | Kim et al. | 438/52 |
| 2006/0211233 A1 * | 9/2006 | Gan et al. | 438/613 |
| 2007/0052046 A1 * | 3/2007 | Chu et al. | 257/415 |
| 2007/0070448 A1 * | 3/2007 | Jung et al. | 358/482 |
| 2007/0114623 A1 * | 5/2007 | Kuisma | 257/415 |
| 2007/0158787 A1 * | 7/2007 | Chanchani | 257/619 |
| 2008/0001241 A1 * | 1/2008 | Tuckerman et al. | 257/434 |
| 2008/0067652 A1 | 3/2008 | Menard et al. | |
| 2008/0083964 A1 * | 4/2008 | Fujimoto et al. | 257/432 |
| 2008/0144863 A1 * | 6/2008 | Fazzio et al. | 381/190 |
| 2008/0290430 A1 | 11/2008 | Mahadevan et al. | |
| 2009/0101915 A1 * | 4/2009 | Weng et al. | 257/72 |
| 2009/0161262 A1 * | 6/2009 | Childress et al. | 360/314 |
| 2009/0236678 A1 * | 9/2009 | Okudo et al. | 257/415 |
| 2009/0263931 A1 * | 10/2009 | Blanchard | 438/98 |
| 2010/0015808 A1 * | 1/2010 | Ozawa | 438/703 |
| 2010/0065934 A1 * | 3/2010 | Eriksen et al. | 257/419 |
| 2010/0140618 A1 * | 6/2010 | Reinmuth et al. | 257/49 |
| 2010/0176466 A1 * | 7/2010 | Fujii et al. | 257/415 |
| 2010/0193884 A1 * | 8/2010 | Park et al. | 257/414 |
| 2010/0283138 A1 * | 11/2010 | Chen et al. | 257/678 |

OTHER PUBLICATIONS

Taiwan Patent Office, Office Action, Patent Application Serial No. 098124843, Sep. 26, 2012, Taiwan.

* cited by examiner

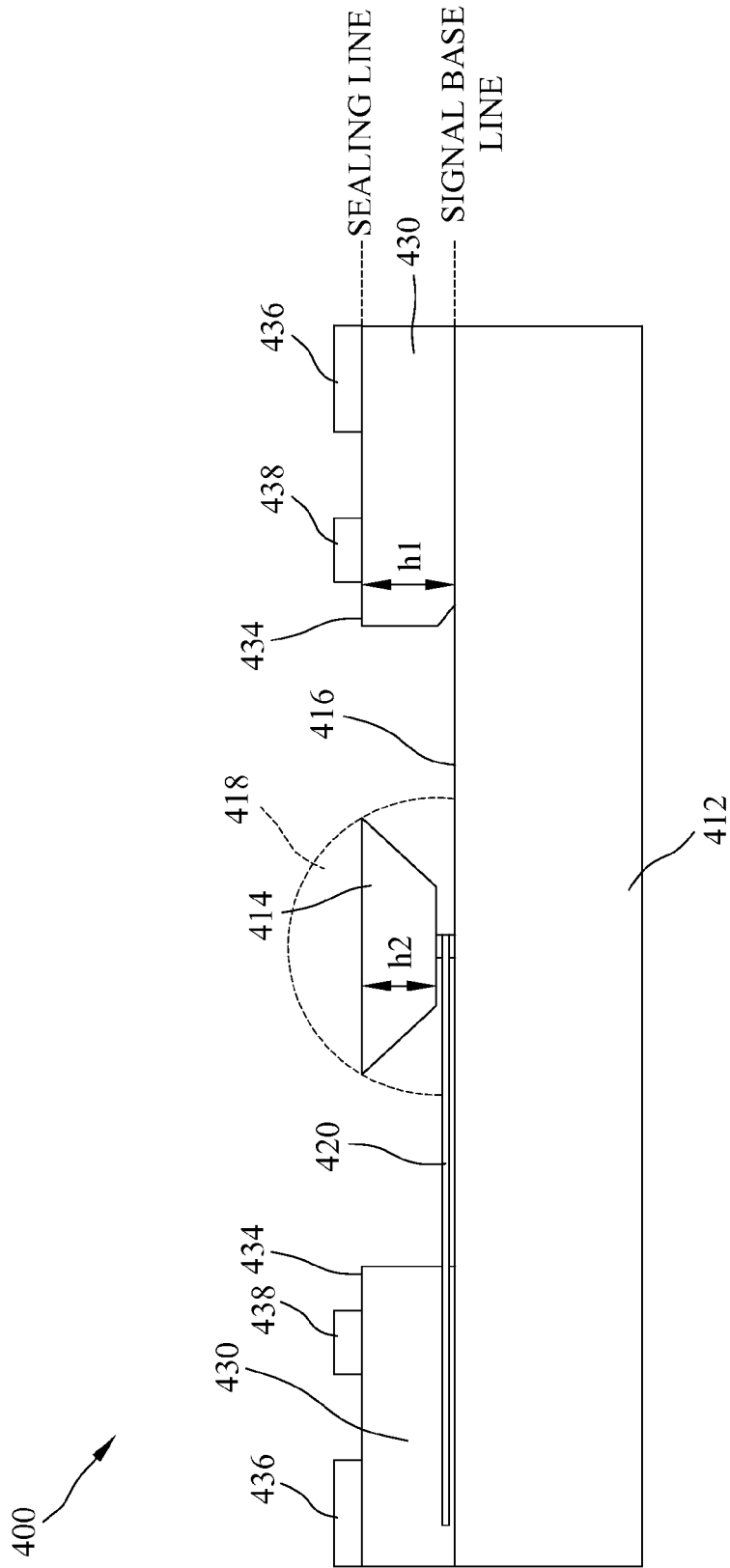

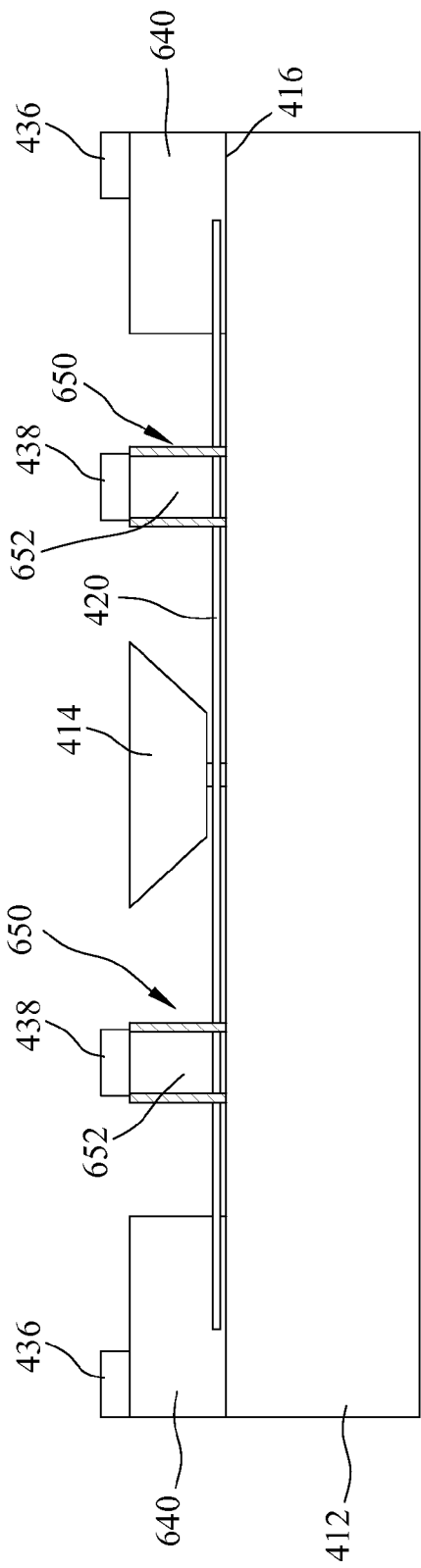
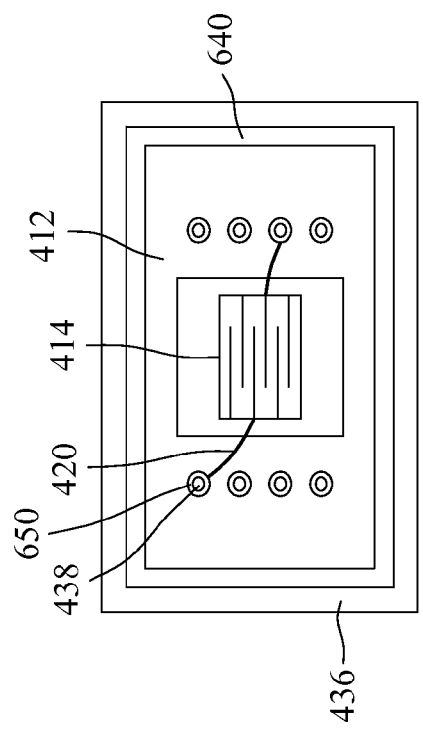
FIG.10A
FIG.10B

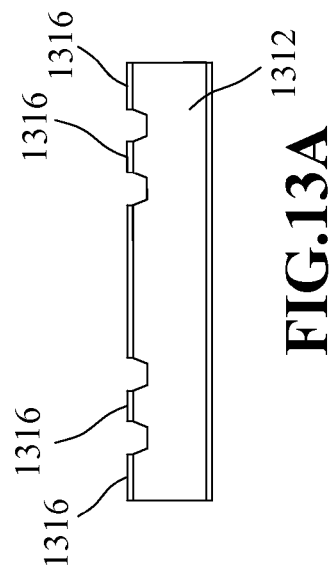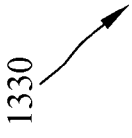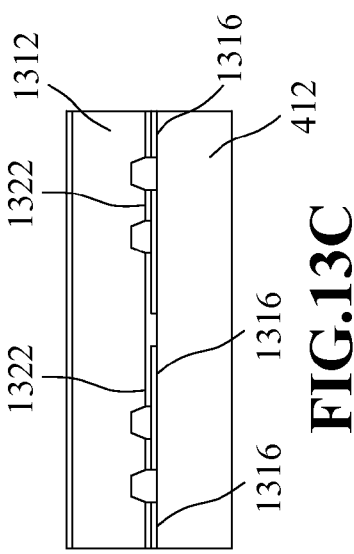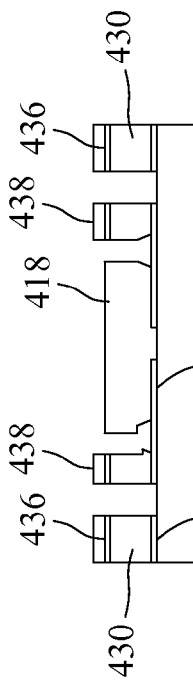
FIG.13A
FIG.13B
FIG.13C
FIG.13D

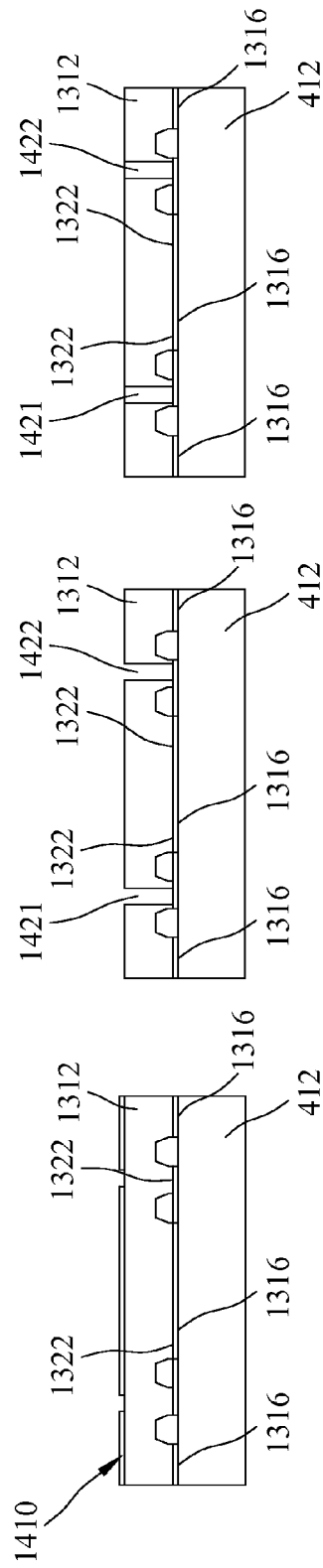

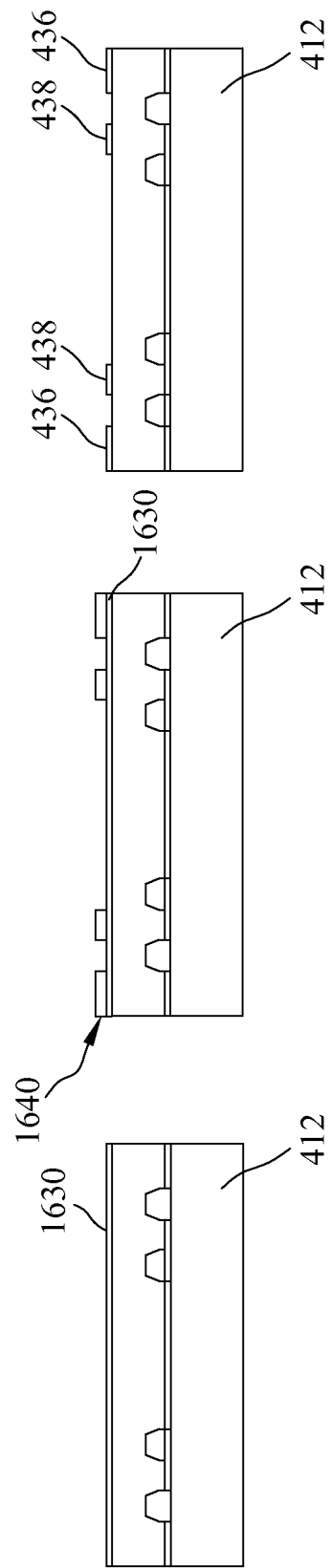

STRUCTURE AND FABRICATION METHOD OF A SENSING DEVICE

TECHNICAL FIELD

The present invention generally relates to a structure and fabrication method of a sensing device.

BACKGROUND

The micro fabrication technology enables the micro-electro-mechanical system (MEMS) to integrate mechanical elements, sensing elements, actuators and electronic elements on a common silicon substrate. In recent years, MEMS accelerometers are grown more than hundred-fold in the communication market, such as cell phones. Many technologies on MEMS accelerometer structure are developed.

U.S. Patent Publication No. 2007/0114623 discloses a method for manufacturing a micro-electro-mechanical component, and a micro-electro-mechanical component. As shown in FIG. 1, the disclosed technology uses a cover part 120 with vertical electroplated conductive areas 110 for the vertical integration system module package of preliminary sealing mount package of sensor chip and application specific IC (ASIC). This package is to assemble preliminary sealing mount packaged MEMS sensor chip 130 and ASIC 140 through anodic bonding and flip-flop bonding processes respectively, such as using arranged flip-flop bonding bumps 161-163 and bump connectors 169-170, to the opposite sides of cover part 120. Between ASIC 140 and MEMS sensor chip 130, the serial connection of the system routing is achieved through the conductive layout and vertical electroplated conductive areas 110 on both sides of cover part 120. The flip-flop bonding process of ASIC 140 and cover part 120 is conducted in an individual chip bonding manner.

U.S. Pat. No. 6,750,521 discloses a surface mount package for MEMS components. As shown in FIG. 2, capped chip 216 is bonded to device chip 212 through seal ring 232 using solder bonding. Capped chip 216 includes a lower surface 222 facing device chip 212, an opposite upper surface 224 and electronic connection elements between the two surfaces. These electronic connection elements electrically communicate with runner 226 above device chip 212. Runner 226 is electrically connected to a micromachine 214 to provide a signal path from micromachine 214 to the exterior of device chip 214.

Capped chip 216 further includes a bond pad 220 to communicate electrically with electronic connection elements. Through solder connection 230 formed by the reflow of solder bump 234 above bond pad 220, capped chip 216 can be packaged to a circuit board including device chip 212 and micromachine 214 in a surface mount package manner. Micromachine 214 above device chip 212 is included inside a cavity 218; hence, the surface mount package reserves the sensing cavity space in capped chip 216.

U.S. Pat. No. 7,275,424 discloses a wafer level capped sensor. As shown in FIG. 3, sensor 310 comprises a die 314, a cap wafer 312, and a conductive pathway 318. Die 314 includes a working portion 330. Cap wafer 312 and die 314 are coupled to a part of working portion 330. Flip-flop contact balls 342 are formed on metal contacts 340, and conductive pathway 318 passes through cap wafer 312 and extends to working portion 330 to provide an electrical interface to working portion 330. Cap wafer 312 includes a cavity 326 to form an internal chamber to protect working portion 330 of die 314. Hence, sensing cavity chamber of sensor 310 is reserved in cap wafer 312. Gap 334 between cap wafer 312 and die 314 may be filled with polymer and seal glass 352.

SUMMARY

The disclosed exemplary embodiments provide a structure and fabrication method of a sensing device.

In an exemplary embodiment, the disclosed relates to a structure of a sensing device, comprising a substrate, a sensor member, at least an external conductive wire and a standing-ring member. The substrate has an upper surface, and the sensor member, external conductive wire and stand-ring member are all located on the upper surface. The sensor member is located at a central area of the upper surface, surrounded by the standing-ring member. The sensor member and the standing-ring member are electrically connected through at least an external conductive wire.

In another exemplary embodiment, the disclosed relates to a fabrication method of a sensing device. The fabrication method comprises: fabricating a mass wafer member so that the mass wafer member has a patterned upper surface, and a plurality of first metal contacts on the upper surface; fabricating a substrate wafer member so that an upper surface of the substrate wafer member has a plurality of second metal contacts; flipping the mass wafer member, clamping and anodic bonding the substrate wafer member to assemble a device wafer; and executing an oxide layer removal process on the device wafer, forming a sensor member at the central area of the mass wafer member above the upper surface of the substrate wafer member and reserving an outer ring area of the mass wafer member to form a standing-ring surrounding the sensor member.

The foregoing and other features, aspects and advantages of the exemplary embodiments will become better understood from a careful reading of a detailed description provided herein below with appropriate reference to the accompanying drawings.

BRIEF DESCRIPTION OF THE DRAWINGS

FIG. 4A shows an exemplary schematic view of a structure of a sensing device, consistent with certain disclosed embodiments.

FIG. 10A shows an exemplary schematic view of an extension of FIG. 6, consistent with certain disclosed embodiments.

FIG. 10B shows an exemplary top view of FIG. 10A, consistent with certain disclosed embodiments.

FIGS. 13A-13D show an exemplary fabrication method for a sensing device, consistent with certain disclosed embodiments.

FIGS. 14A-14C show an exemplary flow of executing a TSV process to form the conductive through-via of a standing-ring member, consistent with certain disclosed embodiments.

FIGS. 16A-16C shows an exemplary flow of executing a metal bump process to form the sealing pad and at least a signal pad on the upper surface of the standing-ring member, consistent with certain disclosed embodiments.

DETAILED DESCRIPTION OF THE PREFERRED EMBODIMENTS

Figure 1:
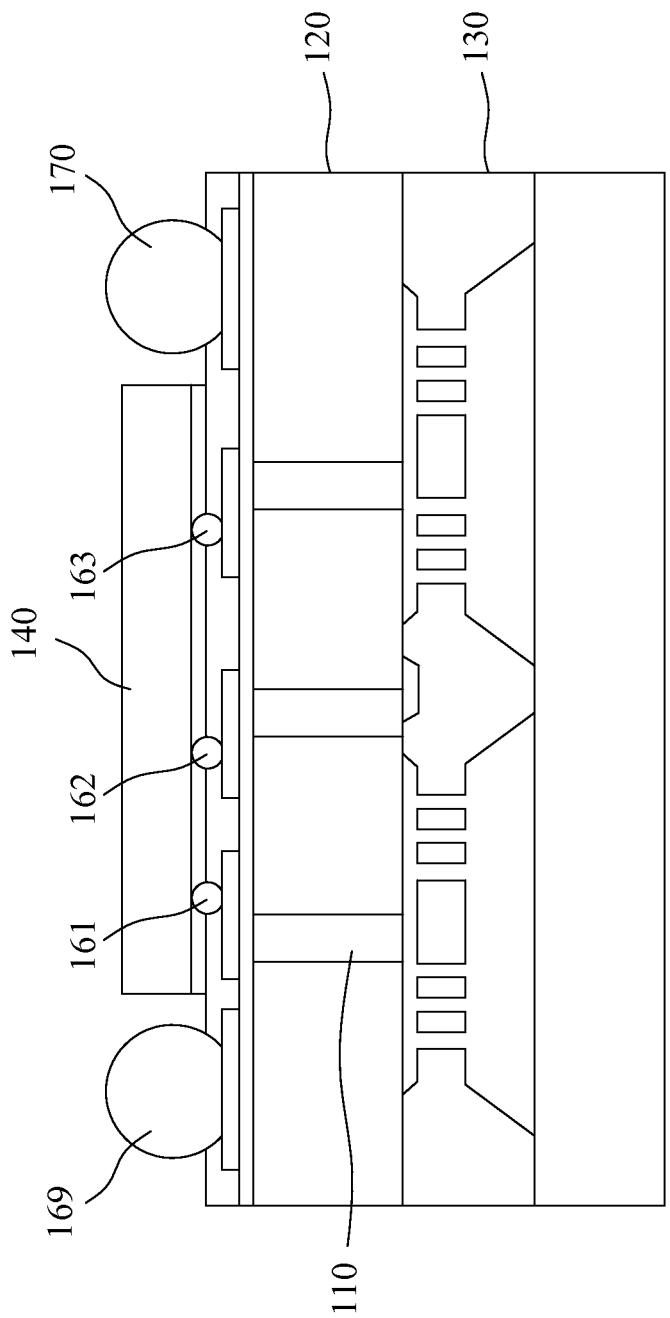
FIG. 1 shows an exemplary schematic view of a MEMS device.
Figure 2:
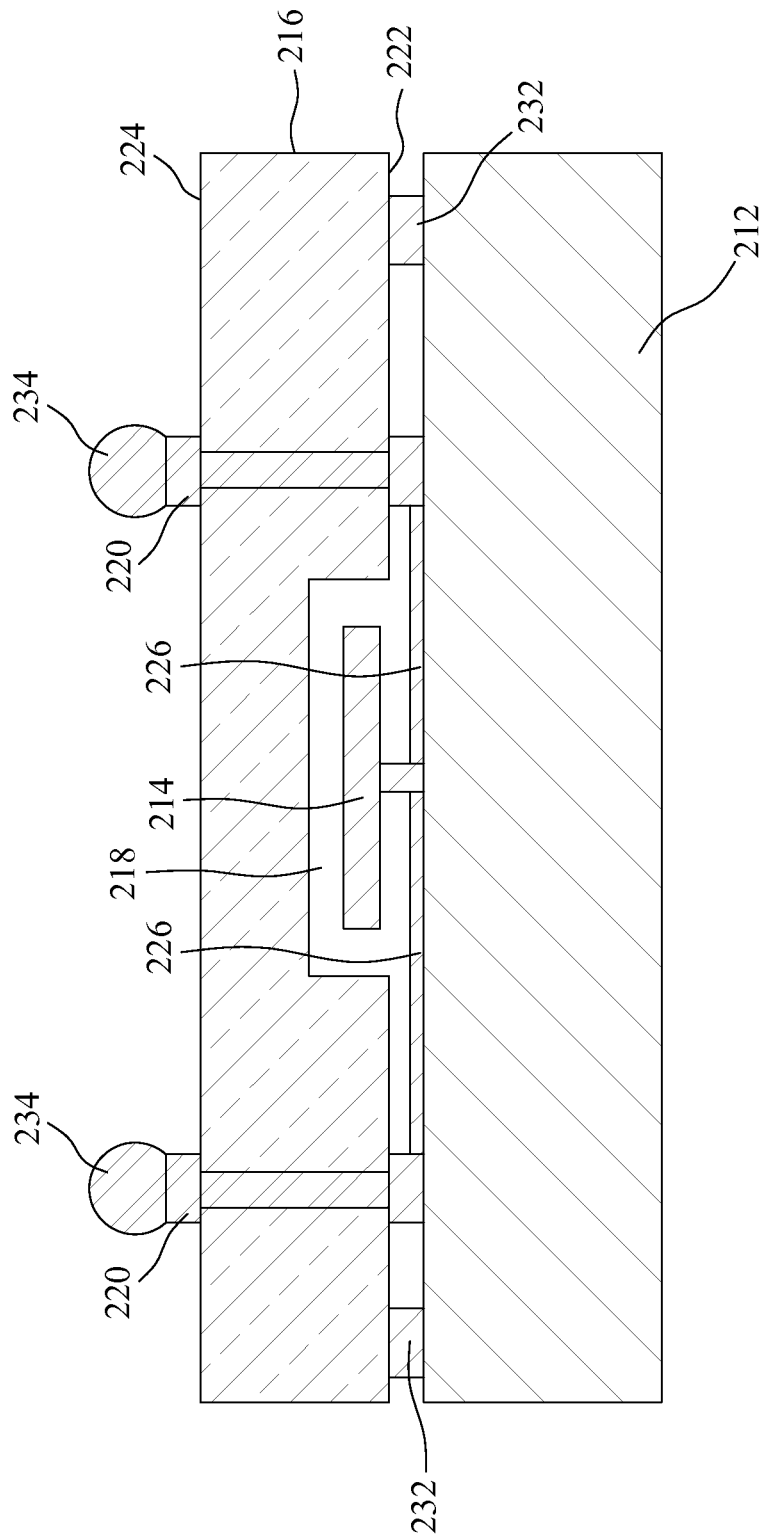
FIG. 2 shows an exemplary schematic view of a surface package of a MEMS device.
Figure 3:
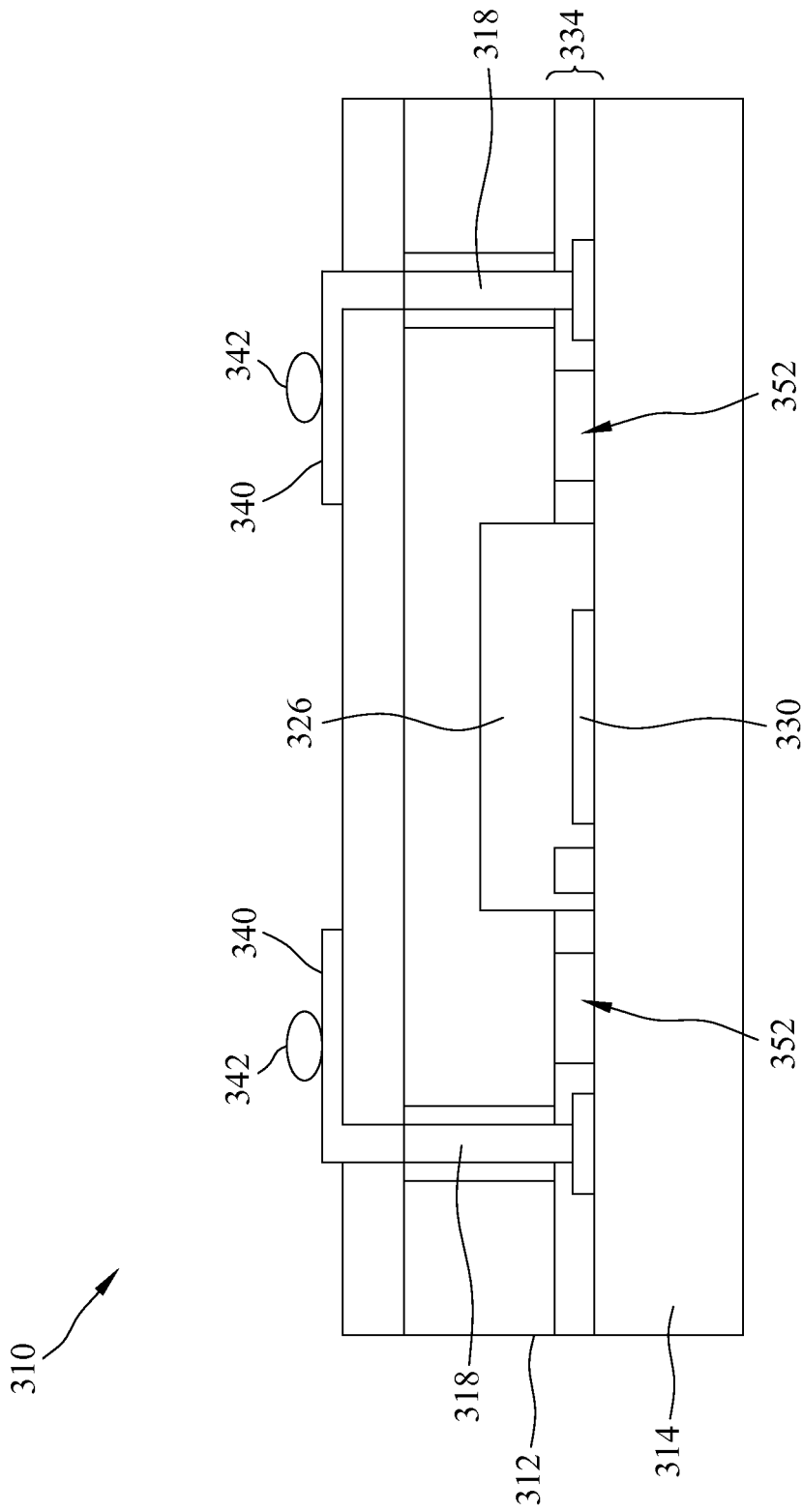
FIG. 3 shows an exemplary schematic view of a wafer-level cover plate sensing device.

FIG. 4A shows an exemplary schematic view of a structure of a sensing device, consistent with certain disclosed embodiments. Referring to FIG. 4A, sensing device 400 comprises a substrate 412, a standing-ring member 430, a sensor member 414 and at least an external conductive wire 420. Substrate 412 includes an upper surface 416. Sensor member 414, external conductive wire 420 and standing-ring member 430 are all located above upper surface 416. Sensor member 414 is located at a central area 418 above upper surface 416 of substrate 412. Standing-ring member 430 above upper surface 416 surrounds sensor member 414, and separates a sealing line and a signal base line so that the fabrication of the sensing device is flexible. Sensor member 414 and stand-ring member 430 are electrically connected through external conductive wire 420. External conductive wire 420 is made of conductive material, such as, metal wire of Cr/Pt.

Figure 4B:
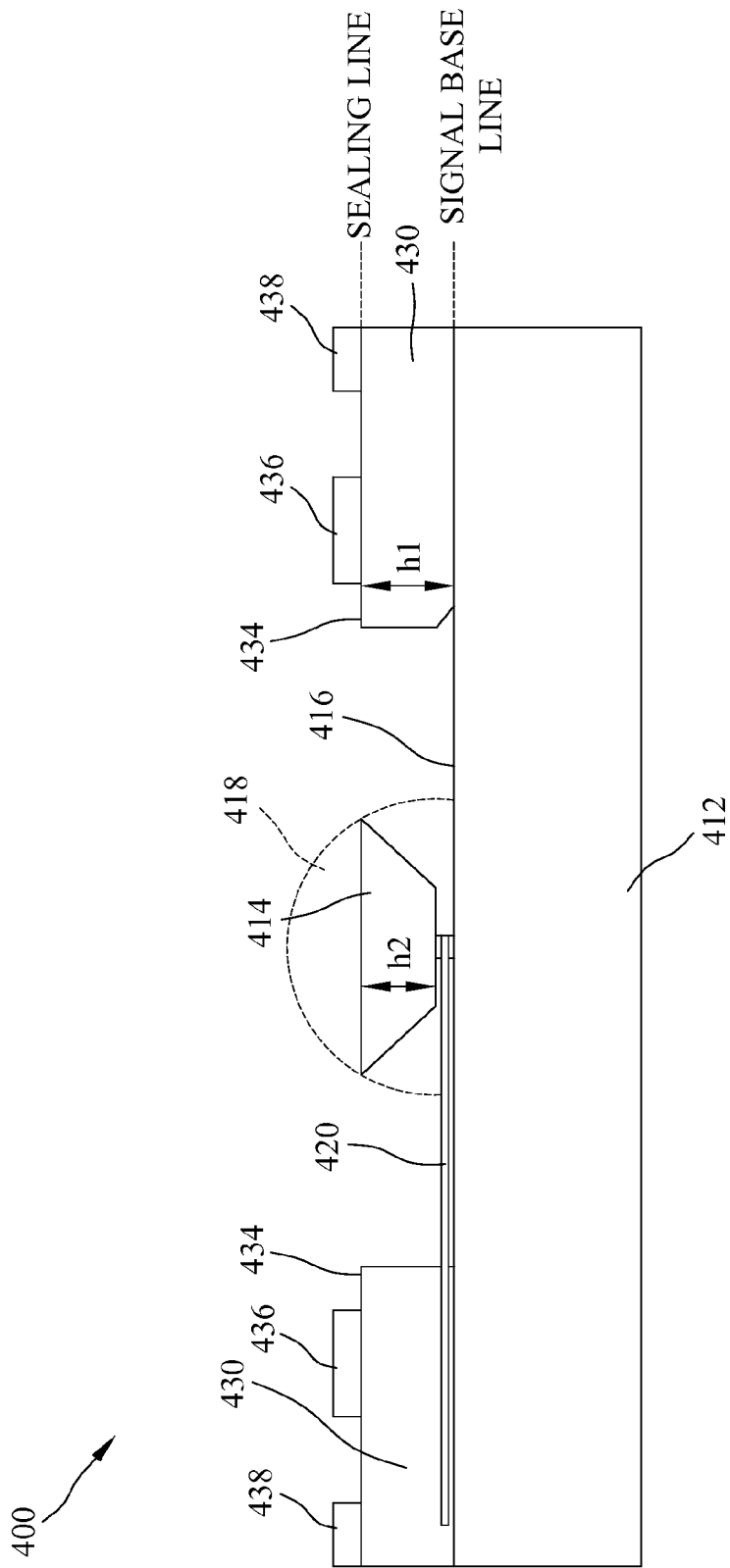
FIG. 4B shows an exemplary schematic view of FIG. 4A with sealing pad and signal pad switching places, consistent with certain disclosed embodiments.

Height h1 of standing-ring member 430 and height h2 of sensor member 414 may be designed in accordance with the actual application. For example, when sensing device 400 and a chip cover plate are integrated as a packaged device, h1 may be higher than h2 so that a gap exists between sensor member 414 and chip cover plate. In the disclosed exemplary embodiment, upper surface 434 of standing-ring member 430 may further include a patterned metallurgy layer as sealing and signal pads, such as, sealing pad 436 and signal pad 438. The locations of sealing pad 436 and signal pad 438 may be exchanged. In FIG. 4A, sealing pad 436 is located at the outer side of signal pad 438, while in FIG. 4B, sealing pad 436 is at the inner side of signal pad 438.

Sensing device 400 may be integrated into a packaged device by conductive material and a cover plate. The cover plate may be an ASIC element, or a general purpose cover plate. The conductive material between sensing device 400 and the cover plate may include, such as, sealing metal, a sealing pad and at least a signal pad. The bonding of the sensing device and the cover plate will be described with figures later.

There are many embodiments for the structure of standing-ring member 430, such as, sensor member 414 and standing-ring member 430 are electrically connected through external conductive wire 420 and standing-ring member 430 may use conductive through-vias for signal input/output with the signal pad. The outer area of conductive through-holes may be wrapped with an isolation layer. The following describes several exemplary embodiments of the structures for the standing-ring member.

Figure 5:
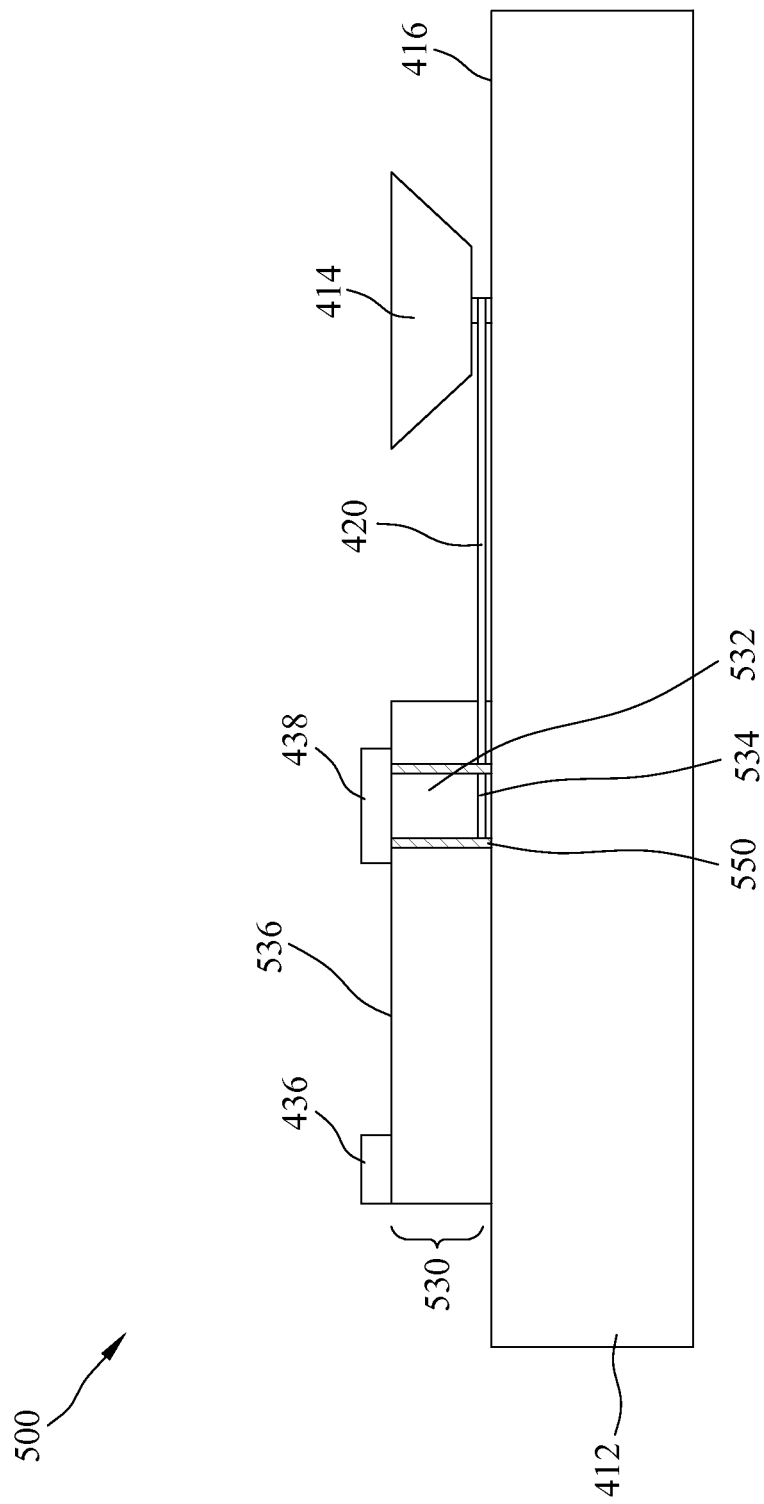
FIG. 5 shows an exemplary schematic view of a first exemplary standing-ring structure, consistent with certain disclosed embodiments.

FIG. 5 shows an exemplary schematic view of a first exemplary standing-ring structure, consistent with certain disclosed embodiments. In sensing device 500, standing-ring member 530 at least includes a conductive through-via 532, one end 534 of conductive through-via 532 is electrically connected to external conductive wire 420, and an isolation layer 550 is formed between conductive through-hole 532 and standing-ring member 530. In other words, standing-ring member 530 is a common standing-ring structure. Conductive through-via 532 is a through-silicon via (TSV) filled with conductive material, such as, metal Cu.

As shown in the exemplary embodiment of FIG. 5, an upper surface 536 of standing ring member 530 may further include a sealing pad and at least a signal pad on the top, such as sealing pad 436 and signal pad 438. Signal pad is distributed above the other end of conductive through-via 532.

Figure 6:
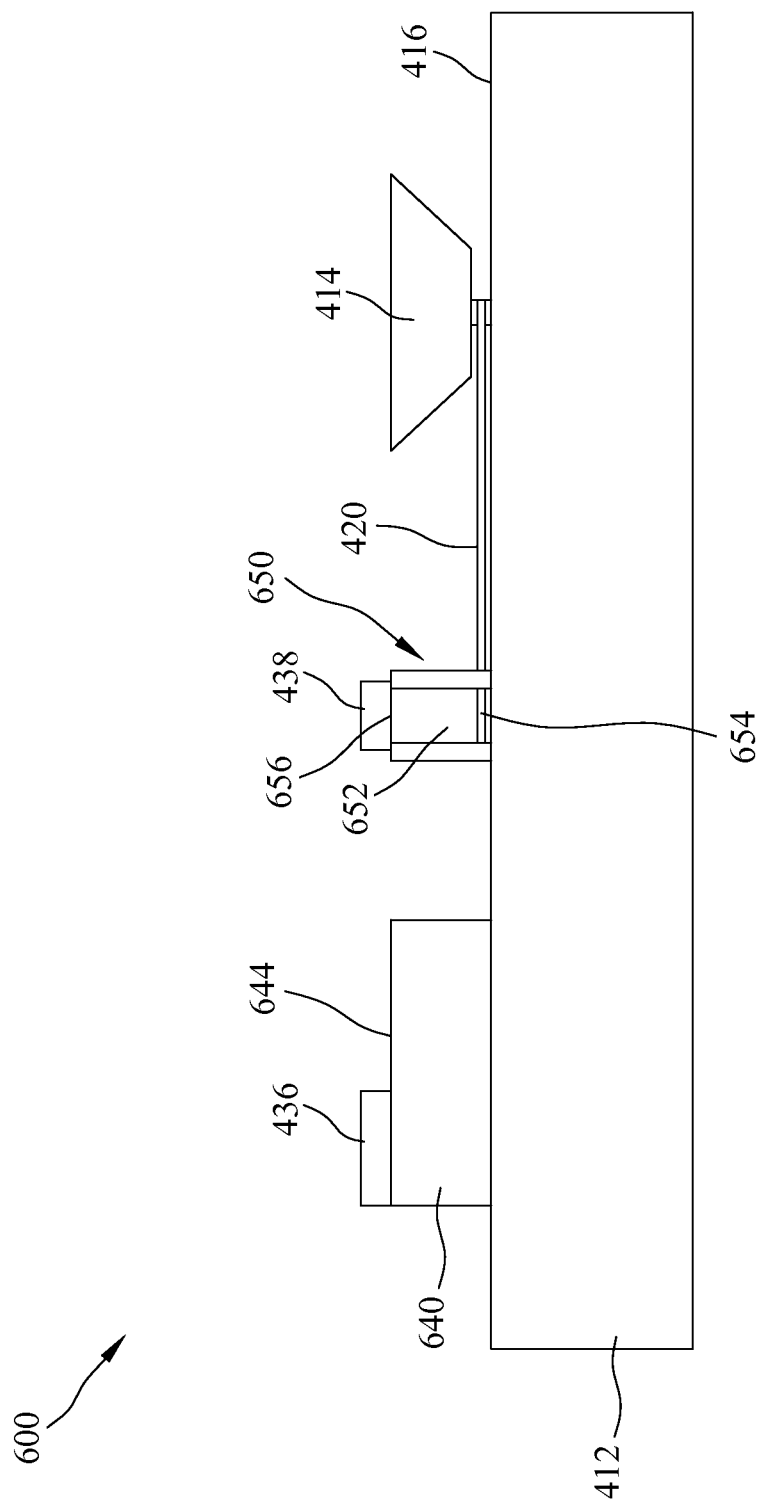
FIG. 6 shows an exemplary schematic view of a second exemplary standing-ring structure, consistent with certain disclosed embodiments.

FIG. 6 shows an exemplary schematic view of a second exemplary standing-ring structure, consistent with certain disclosed embodiments. In sensing device 600, standing-ring member at least includes an independent standing-ring 640 and at least a separated post 650. Each separated post 650 has a conductive through-via 652, with one end 654 electrically connected to the external conductive wire 420 of sensor member 414. In other words, standing-ring member 640 is a separated standing-ring structure, comprising a sealing standing-ring and at least an interconnected separated post. Conductive through-via 652 is a through-silicon via (TSV) filled with conductive material, such as, metal Cu.

As shown in the embodiment of FIG. 6, an upper surface of the standing ring member may further include a sealing pad and at least a signal pad on the top, such as sealing pad 436 and signal pad 438. Signal pad 436 is located above upper surface 644 of independent standing-ring 640. Within each separated post 650, the other end 656 of conductive through-via 652 has signal pad 438 on the top.

Figure 7:
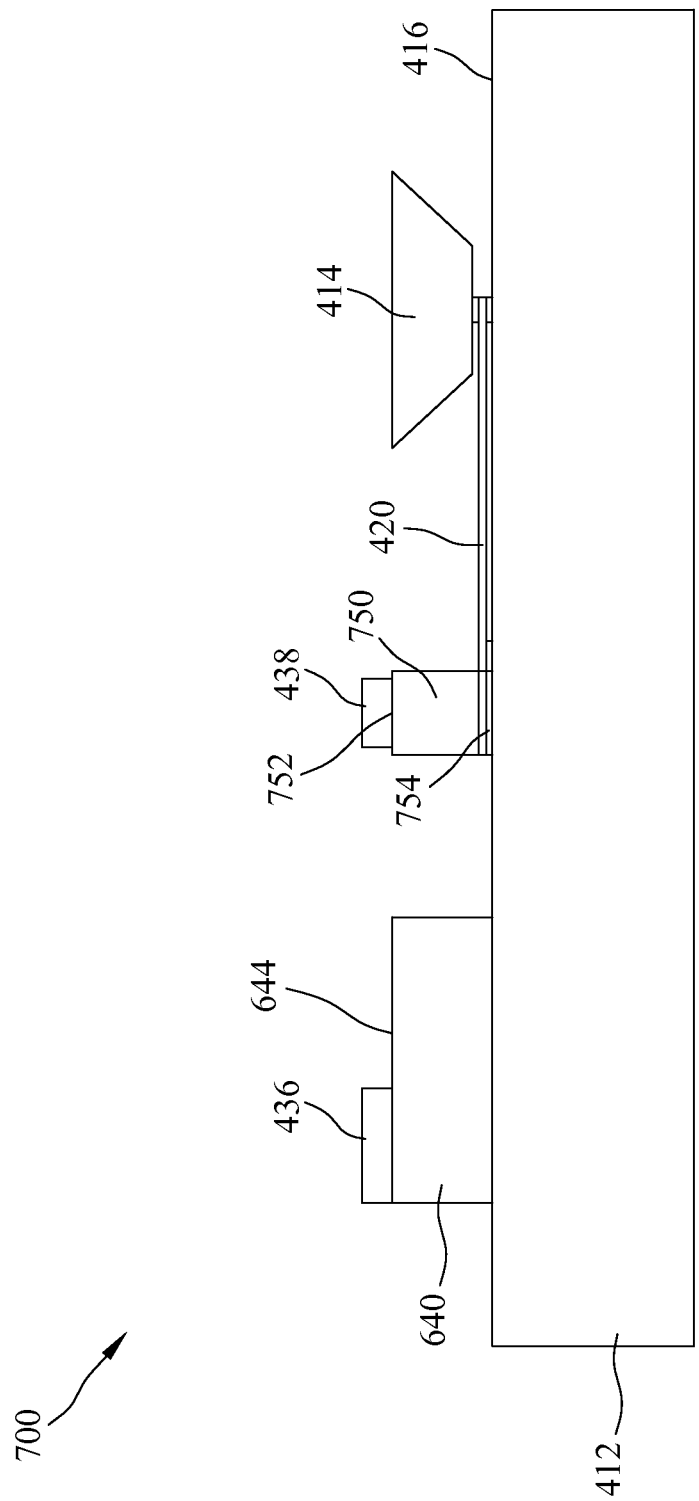
FIG. 7 shows an exemplary schematic view of a third exemplary standing-ring structure, consistent with certain disclosed embodiments.

FIG. 7 shows an exemplary schematic view of a third exemplary standing-ring structure, consistent with certain disclosed embodiments. In sensing device 700, the standing-ring member at least includes an independent standing-ring 640 and at least a separated post 750. Each separated post 750 has one end 754 electrically connected to external conductive wire 420 of sensor member 414. In other words, the standing-ring member is a silicon interconnection structure, comprising a sealing standing-ring and a plurality of interconnected separated posts.

As shown in the embodiment of FIG. 7, an upper surface of the standing ring member may further include a sealing pad and at least a signal pad on the top, such as sealing pad 436 and signal pad 438. Signal pad 436 is located above upper surface 644 of independent standing-ring 640. Within each separated post 750, the other end 752 has signal pad 438 on the top.

Figure 8A:
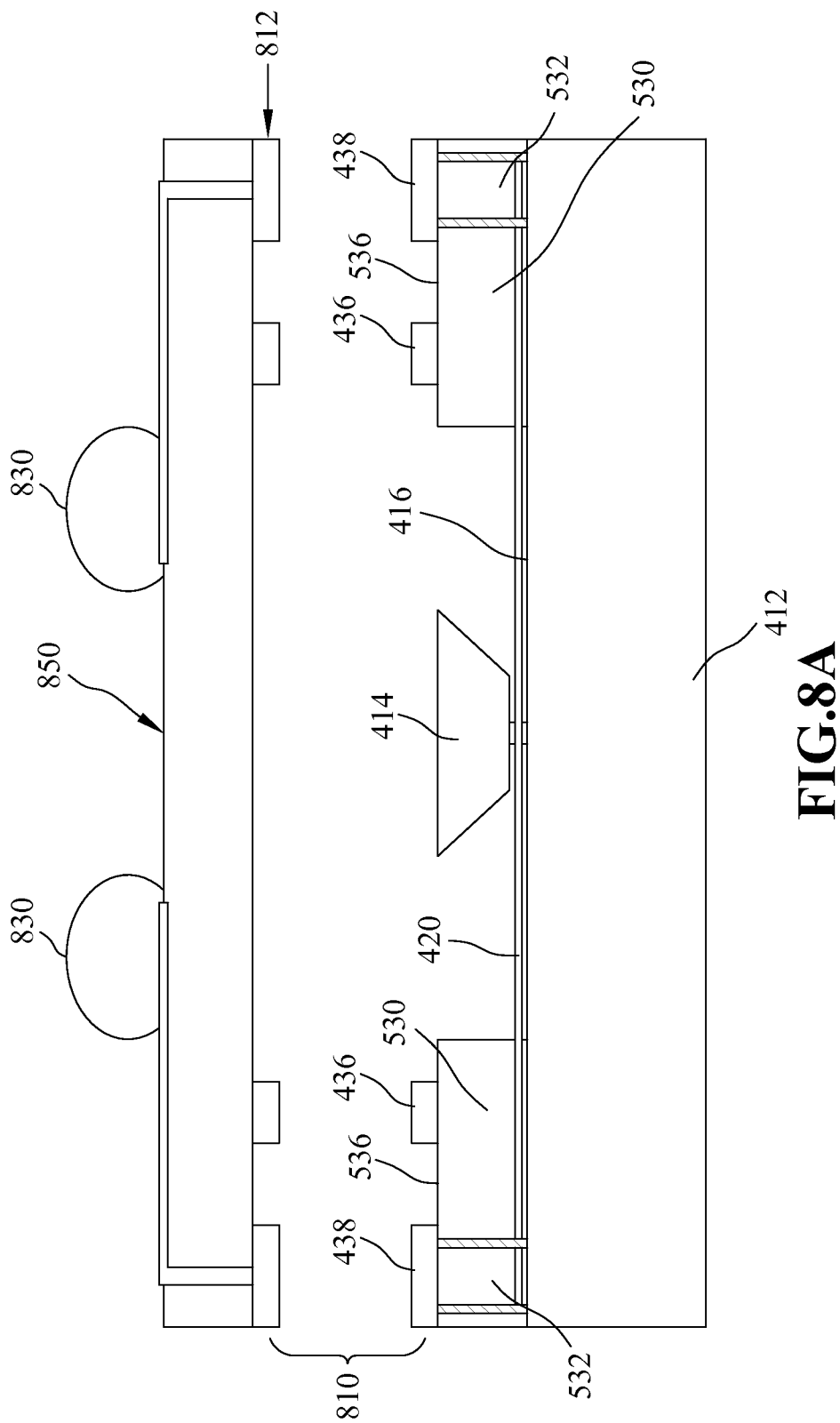
FIG. 8A shows an exemplary view of integrating with a cover plate into a packaged device via conductive material, consistent with certain disclosed embodiments.

As aforementioned, sensing device may be integrated into a packaged device by using conductive material and a cover plate. In the disclosed exemplary embodiments of FIGS. 5-7, the sensing device may be integrated with a cover plate into a packaged device by using sealing pads and signal pads. Take the embodiment of FIG. 5 as an example. FIG. 8A shows an exemplary schematic view of integrating with a cover plate into a packaged device by using conductive material, consistent with certain disclosed embodiments.

In FIG. 8A, conductive material 810 between sensing device 500 and cover plate 850 at least includes a sealing pad and at least a signal pad. Conductive material 810 may further include a patterned layer of sealing metal 812. As shown in FIG. 8A, the sealing pad and at least a signal pad may be formed on top of upper surface 536 of standing-ring member 530 of sensing device 500. Patterned layer of sealing metal 812 may be formed on the inner surface of cover plate 850, and the pattern matches sealing pad 436 and signal pad 438 on standing-ring member 530 of sensing device 500. Patterned layer of sealing metal 812 may also be formed directly on top of sealing pad 436 and signal pad 438 on standing-ring member 530 of sensing device 500. After sensing device 500 and cover plate 850 are integrated into a packaged device, sensing device 500 may communicate electrically with solder bump 830 through external conductive wire 420, conductive through-via 652, signal pad 438, and sealing metal 812. Sensing device 500 may be tightly bonded to cover plate 850 through sealing pad 436 and sealing metal 812.

A concave area may also be formed at a center area of the inner surface of cover plate 850 so that a gap exists between the cover plate and the sensor member of the sensing device. In this manner, the actuation of the sensing member is more flexible.

Figure 8B:
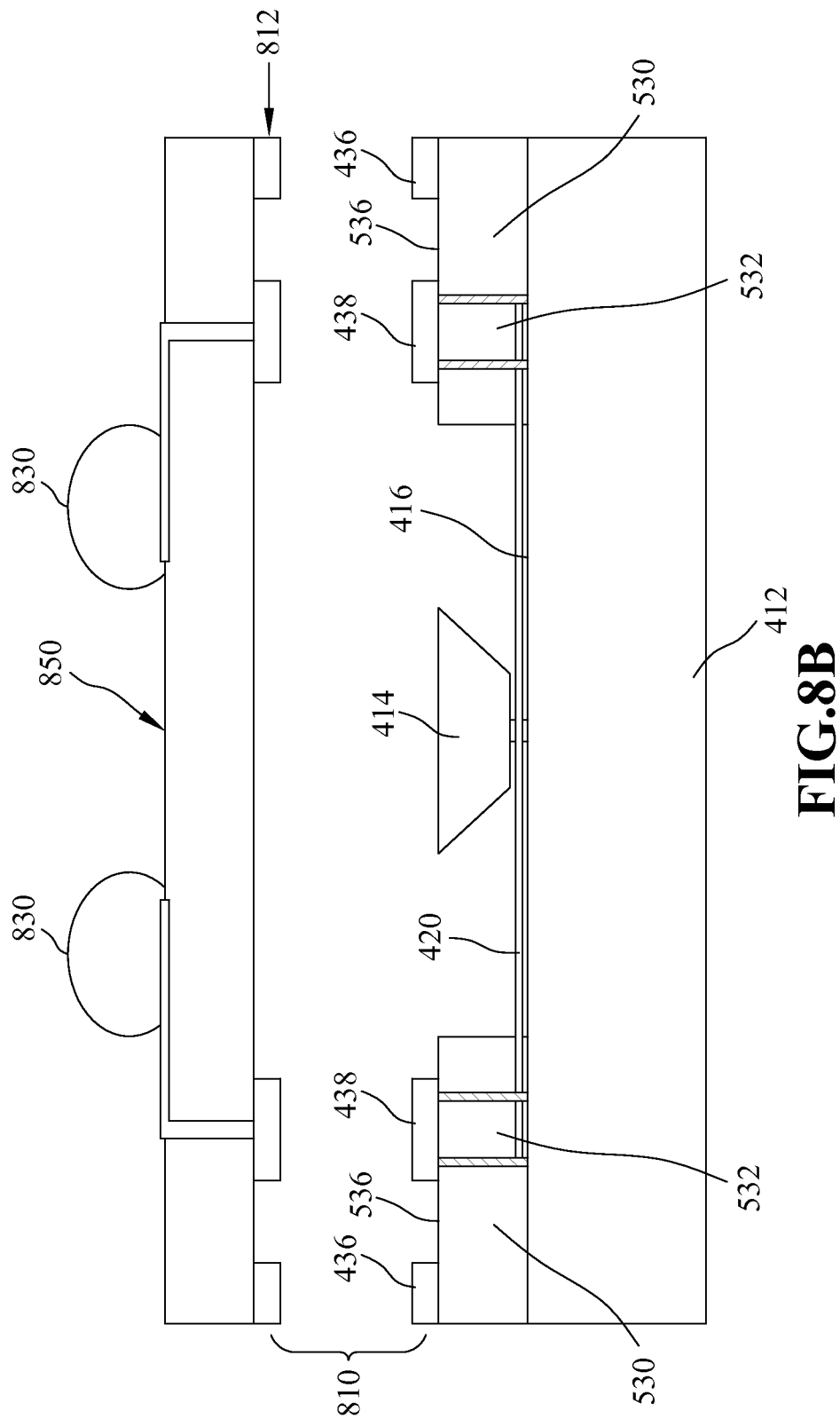
FIG. 8B shows an exemplary view of FIG. 8A with sealing pad and signal pad switching places, consistent with certain disclosed embodiments.

In FIG. 8A, sealing pad 436 is located at the inner side of signal pad 438, while in FIG. 8B, sealing pad 436 is located at the outer side of signal pad 438. Conductive material 810 and sealing metal 812 are arranged in similar manner, and the description is omitted here.

In FIG. 8A or FIG. 8B, the sensing device and cover plate are integrated into a packaged device to simplify the number of layers of a system vertical stack. Between the sensing device and cover plate, the system circuit routes may be accomplished by flexible layout of conductive material 810. Sealing pad 436 and signal pad 438 are made of conductive material, such as, Au/Sn or Cu/Sn. Patterned layer of sealing metal 812 is also a conductive material, such as, Au/Sn or Cu/Sn.

Sensing device 500 may form conductive pathway by the internal circuit layout (not shown) of signal pad 438 and cover plate 850, and conduct signal input/output by solder bump 830 above cover plate 850. Solder bump 830 may be, for example, lead-free solder bump.

Similarly, the arrangement of conductive material and sealing metal for the exemplary embodiments in FIG. 6 and FIG. 7 is the same as in FIG. 8A and FIG. 8B, and thus is omitted here. The sensing device and cover plate may be integrated by using a full wafer one-time simultaneous bonding. In comparison with the half-wafer packaging, the packaging of sensing device and cover plate of the disclosed exemplary embodiments may greatly reduce the time for bonding as well as the thickness and foot print area of the system overall package of vertical placement.

FIGS. 5-7 are exemplary cross-sectional partial views for the disclosed sensing device. The following describes the sensing device of the disclosed exemplary embodiments in further details with top views.

Figure 9A:
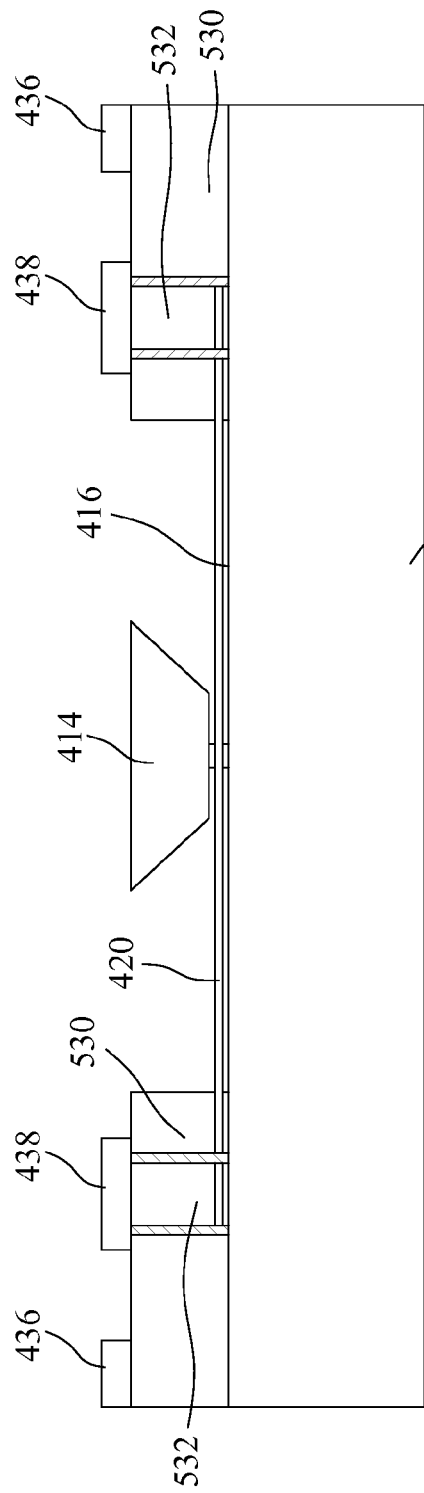
FIG. 9A shows an exemplary schematic view of an extension of FIG. 5, consistent with certain disclosed embodiments.
Figure 9B:
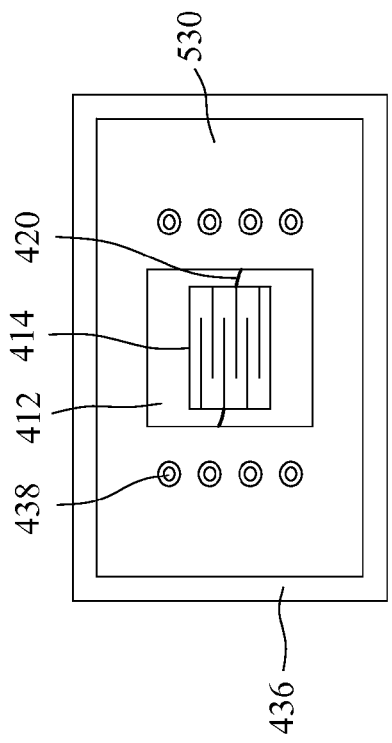
FIG. 9B shows an exemplary top view of FIG. 9A, consistent with certain disclosed embodiments.

FIG. 9A shows an exemplary schematic view of an extension of FIG. 5, consistent with certain disclosed embodiments. In FIG. 9A, the sensing device has a common standing-ring structure of FIG. 5. Hence, sensor member 414 is located at the center part of upper surface 416 of the substrate. Standing-ring member 530 surrounds sensor member 414, and on the upper surface, standing-ring member 530 may further include seal pad 436 and signal pad 438, where signal pad 438 is on conductive through-via 532. The top view of the sensing device is shown in FIG. 9B.

FIG. 10A shows an exemplary schematic view of an extension of FIG. 6, consistent with certain disclosed embodiments. In FIG. 10A, the sensing device has a separated standing-ring structure of FIG. 6. Hence, independent standing-ring member 640 and at least a separated post 650 surround sensor member 414, and are located on upper surface 416 of the substrate. The upper surface of independent standing-ring member 640 may further include seal pad 436, and the upper surface of each separated post 650 may further include a signal pad 438 on the top, where signal pad 438 is on conductive through-via 652. The top view of the sensing device is shown in FIG. 10B.

Figure 11A:
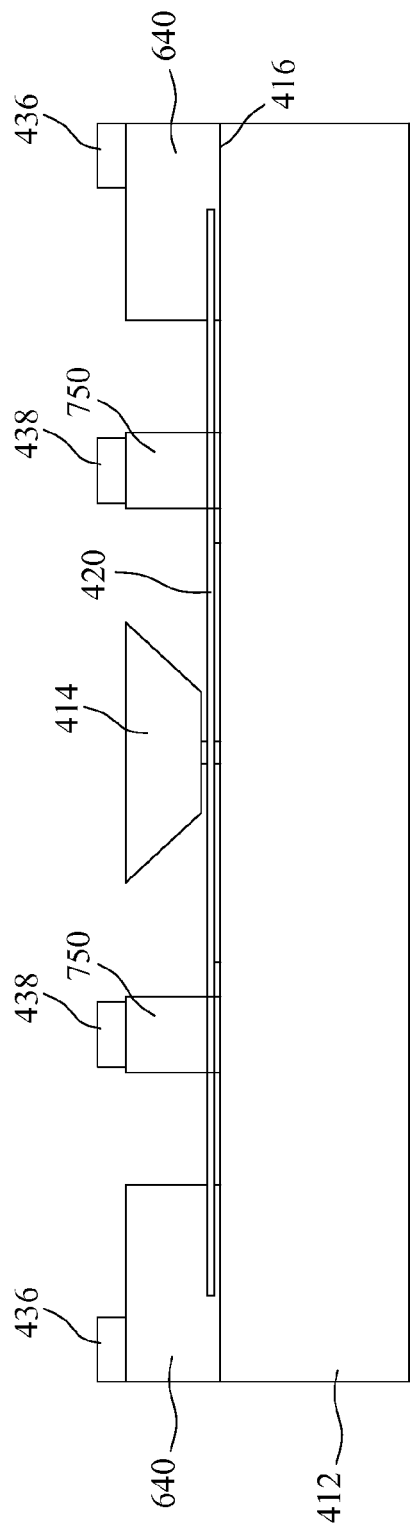
FIG. 11A shows an exemplary schematic view of an extension of FIG. 7, consistent with certain disclosed embodiments.
Figure 11B:
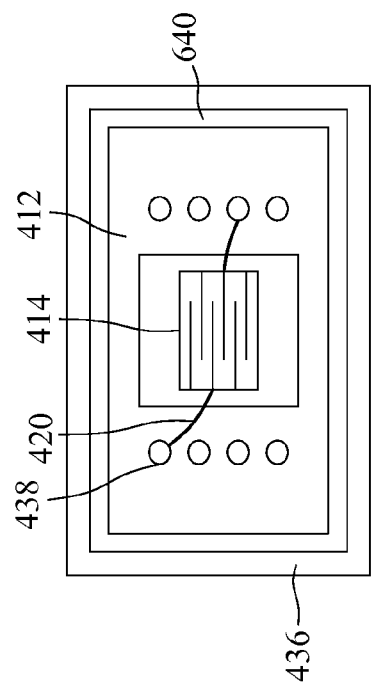
FIG. 11B shows an exemplary top view of FIG. 11A, consistent with certain disclosed embodiments.

FIG. 11A shows an exemplary schematic view of an extension of FIG. 7, consistent with certain disclosed embodiments. In FIG. 11A, the sensing device has a silicon interconnection structure of FIG. 7. Hence, independent standing-ring member 640 and at least a separated post 750 surround sensor member 414, and are located on upper surface 416 of the substrate. The upper surface of independent standing-ring member 640 may further include seal pad 436, and the upper surface of each separated post 750 may further include a signal pad 438 on the top. The top view of the sensing device is shown in FIG. 11B.

The top views in FIG. 9B to FIG. 11B show the disclosed sensing device having a full area array structure. Hence, the package has high contact density to accommodate designs of complex system circuit modules.

Figure 12:
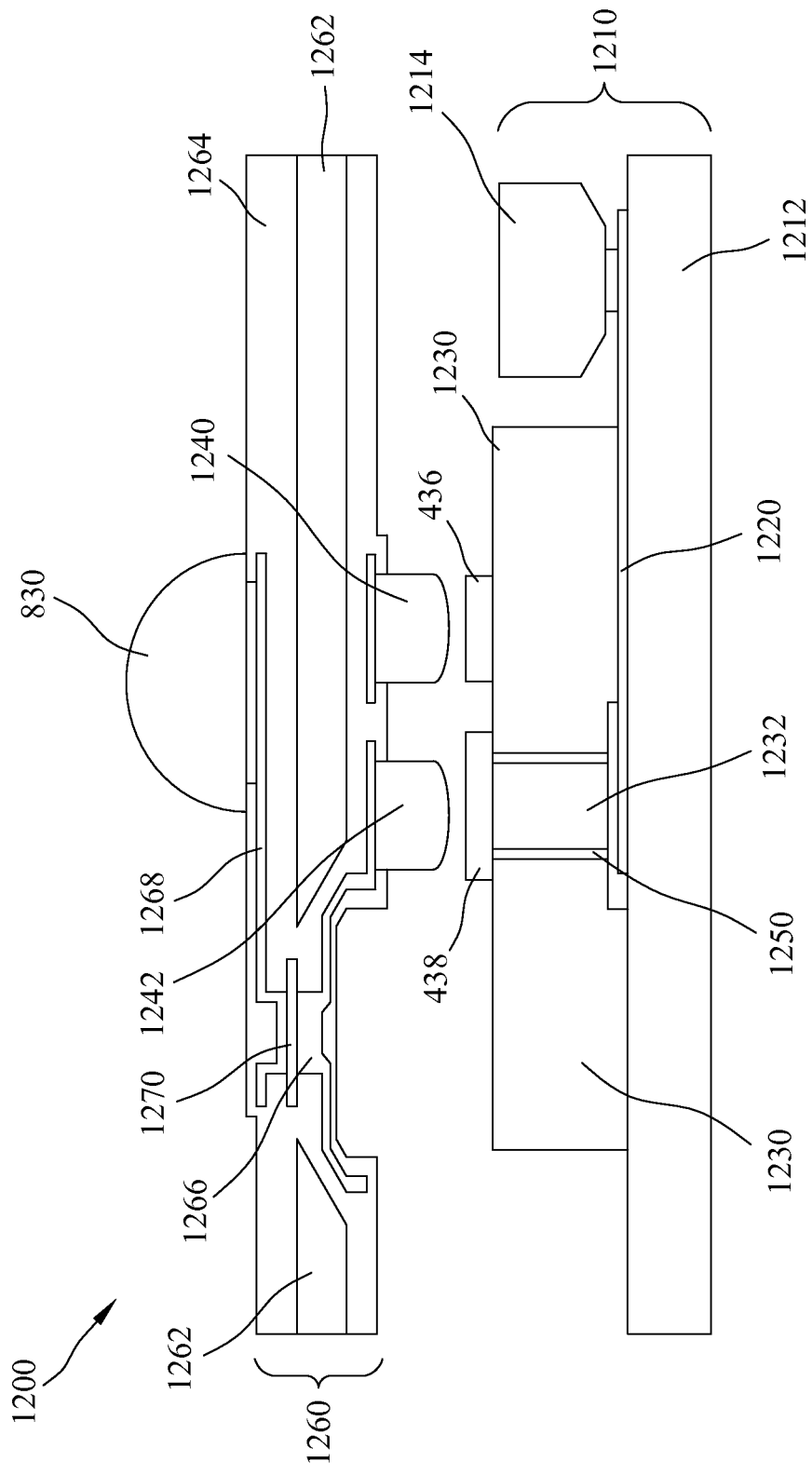
FIG. 12 shows an exemplary cross-sectional view of using the sensing device structure of FIG. 5 to integrate an ASIC device and an acceleration chip into a packaged device, consistent with certain disclosed embodiments.

FIG. 12 shows an exemplary cross-sectional view of using the sensing device structure of FIG. 5 to integrate an ASIC device and a acceleration chip into a packaged device, consistent with certain disclosed embodiments. In FIG. 12, sensor chip 1210 includes a glass substrate 1212, a silicon standing-ring 1230, a silicon comb-driver 1214, and Cr/Pt external conductive wire. The center of standing-ring 1230 is silicon via 1232 filled with Cu. An isolation layer 1250 exists between via 1232 and standing-ring 1230. ASIC device 1260 includes ASIC chip 1262, a stress release layer 1264, at least an Al pad 1270, a via 1266, a plurality of redistribution traces 1268 and signal pad 1242 and sealing pad 1240 on the back of ASIC member device 1260.

Sensor chip 1210 and ASIC device 1260 are integrated into a packaged device 1200 by a thermal press process. The sensing signal of sensor chip 1210 passes signal pad 1242, via 1266, Al pad 1270 to ASIC device 1260 in serial for signal input/output.

The following describes the method for fabricating the sensing device. FIGS. 13A-13D show an exemplary fabrication method for the sensing device, consistent with certain disclosed embodiments. The fabrication of the sensing device may be divided into three stages, i.e., mass wafer fabrication, substrate wafer fabrication and device wafer assembly. As shown in FIG. 13A, mass wafer member 1310 may be fabricated by a mass wafer fabrication process, etching and patterning the upper surface of mass wafer 1312, and forming a plurality of contact metals 1316 on the etched and patterned upper surface. As shown in FIG. 13B, substrate wafer member 1320 may be fabricated by a substrate wafer fabrication process, by forming a plurality of contact metals 1322 on the supper surface of substrate 412.

In the device wafer assembly stage, mass wafer member 1310 is flipped and substrate wafer member 1320 is clamped and anodic bonded to be assembled into a device wafer 1330, as shown in FIG. 13C. Then, an oxidized layer removal process is performed on device wafer 1330, and sensor member 418 is formed at a center area of mass wafer member 1310 above the upper surface of substrate 412 and an outer ring area of mass wafer 1310 is preserved to form standing-ring member 430 surrounding sensor member 418, as shown in FIG. 13D.

The same lithographic etching process may be performed on device wafer 1330, after the oxidized layer removal process, to form the geometric shape of patterned sensor member 418 and surrounding standing-ring member 430. Contact metals 1322 may be used as external conductive wire of sensor member 418. After anodic bonding of mass wafer member 1310 and substrate wafer 1320, standing-ring member 430 and sensor member 418 may be electrically connected by contact metals 1322.

The fabrication processes of mass wafer and substrate wafer are existent semiconductor processes. The fabrication process of mass wafer member 1310 of FIG. 13A may include: performing oxidation later deposition on the upper surface of mass wafer 1312, performing photoresist coating, performing patterning and etching, performing stripping, performing pedestal etching, performing removal, performing contact metal photoresist coating and patterning, performing contact metal deposition and performing contact metal photoresist lift-off.

The fabrication process of substrate wafer member 1320 of FIG. 13B may include: performing contact metal sputtering on upper surface of substrate 412, performing contact metal photoresist coating and patterning, performing contact metal etching, and performing contact metal photoresist removal.

In device wafer assembly, after device wafer 1330 is assembled and oxidized layered removed, a through-silicon via (TSV) process may be executed to form conductive holes of the standing-ring member, or a metal bump process may be executed to form the sealing pad and at least a signal pad on the upper surface of the standing-ring member. FIGS. 14A-14C show an exemplary flow of executing a TSV process to form the conductive through-via of the standing-ring member, consistent with certain disclosed embodiments.

Referring to FIG. 14A, first, a patterned TSV photoresist 1410 is formed on the upper surface of device wafer 1330 after the oxidized layer removal. Then, TSV etching is performed in the outer ring area of mass wafer 1312 to form via, such as via 1421 and via 1422, as shown in FIG. 14B. An isolation layer is deposited to the upper surface of mass wafer 1312 and the inner circle of vias 1421, 1422 (not shown) by a chemical vapor deposition (CVD) process, a conductive layer (not shown) is sputtered on mass wafer 1312, conductive vias 1421, 1422 are filled with conductive material, such as, Cu, and then ground to the designed thickness, as shown in FIG. 14C.

Figure 15B:
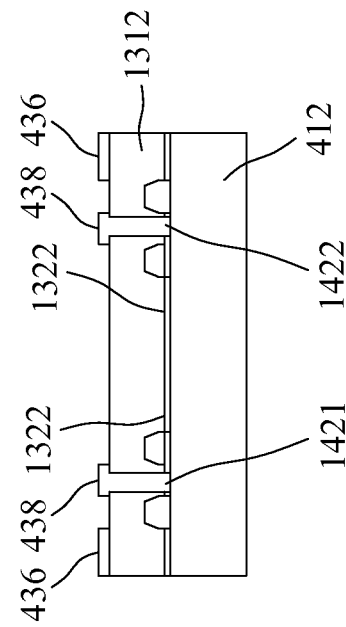
FIGS. 15A-15B shows an exemplary flow of executing a metal bump process to form the sealing pad on the upper surface of the standing-ring member and the sealing pad on the conductive through-via, consistent with certain disclosed embodiments.
Figure 15A:
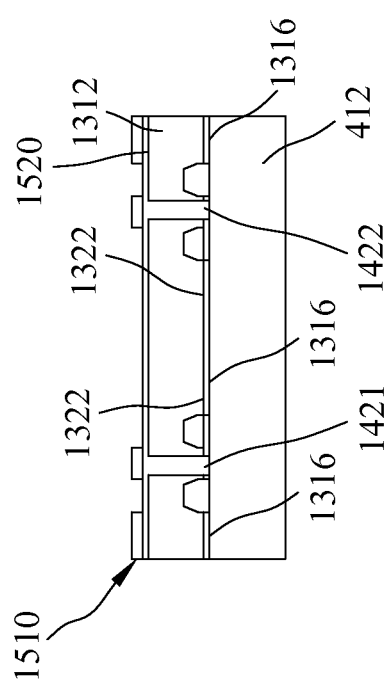

FIGS. 15A-15B show an exemplary flow of executing a metal bump process to form the sealing pad on the upper surface of the standing-ring member and the signal pad on the conductive through-via, consistent with certain disclosed embodiments. The first step is to vapor-plate or electroplate a metal conductive layer 1520 on the upper surface of FIG. 14C, and then form a patterned photoresist 1510, where the patterned photoresist covers each via, i.e., 1421, 1422 and covers the surrounding of sensor member 418 as well as an outer ring on the upper surface, as shown in FIG. 15A. The next step is to etch the conductive material and remove patterned photoresist 1510, as shown in FIG. 15B. The conductive material on vias 1421, 1422 is signal pad 438 and the conductive material on the outer ring on the upper surface is sealing pad 436.

FIGS. 16A-16C show an exemplary flow of executing a metal bump process to form the sealing pad and at least a signal pad on the upper surface of the standing-ring member, consistent with certain disclosed embodiments. The first step is to sputter a metal conductive layer 1630 on the upper surface of device wafer 1330 of FIG. 13C after removing the oxidized layer, as shown in FIG. 16A. Then, the next step is to form a patterned photoresist 1640 at the surrounding of the center area on conductive layer 1630, as shown in FIG. 16B. The next step is to etch conductive layer 1630 and remove patterned photoresist 1640, as shown in FIG. 16C. The conductive layer 1630, after being etched, forms the sealing pad 436 on the upper surface of the standing-ring member and signal pads 438.

Figure 17A:
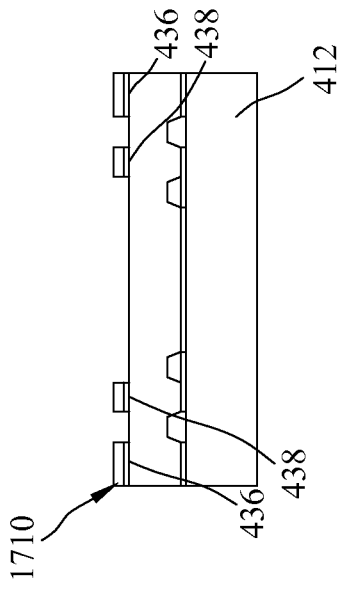
FIGS. 17A-17D shows an exemplary flow illustrating how to form the sensing member, independent standing-ring and separated post of the sensing device structure of FIG. 7, after forming the sealing pad and signal pad on the upper surface of the standing-ring member, consistent with certain disclosed embodiments.
Figure 17B:
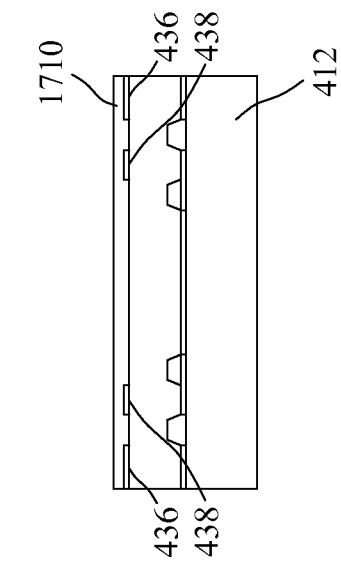
Figure 17C:
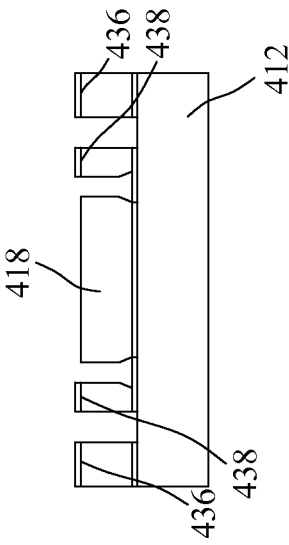
Figure 17D:
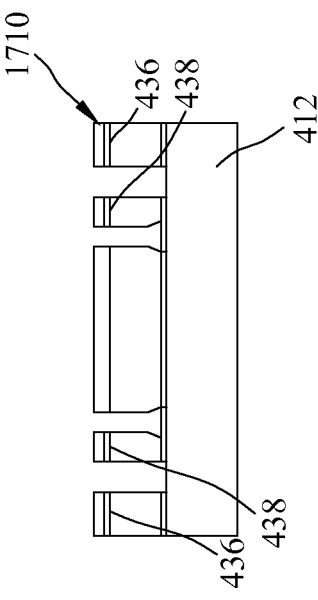

The exemplary flow of FIGS. 17A-17D shows how to form the sensor member, independent standing-ring and separated posts of the sensing device after forming sealing pad 436 and signal pad 438 on the embodiment of sensing device structure of FIG. 7, consistent with certain disclosed embodiments. As shown in FIG. 17A, the first step is to coat a photoresist layer 1710 on the upper surface of FIG. 16C. Then, the next step is to use a lithographic technique to pattern photoresist layer 1710, in other words, to remove the photoresist other than the areas on sealing pad 436 and signal pad 438, as shown in FIG. 17B. Then, an etching process is performed, as in FIG. 17C. Finally, photoresist 1710 is removed as shown in FIG. 17D. In this manner, the sensor member, independent standing-ring and separated post of the sensing device are all formed.

If the standing-ring member is as the exemplary embodiment shown in FIG. 5, the process shown in FIGS. 14A-14C may be performed to form conductive through-via 532 of standing-ring member 530, where before the conductive material process, an isolation layer is deposited to electrically isolate the conductive material and prevent the subsequent signal pad or sealing pad from connecting with the device wafer. Then, the exemplary process of FIGS. 15A-15B may be used to form the signal pad on conductive through-via 532 and the sealing pad on standing-ring member 530.

If the standing-ring member is as the exemplary embodiment shown in FIG. 6, the exemplary process shown in FIGS. 14A-14C may be performed to form the conductive through-via of the standing-ring member, and the exemplary process of FIGS. 15A-15B may also be used to form the signal pad on the conductive through-via and the sealing pad on the standing-ring member. Then, an etching process is further used to divide the standing-ring member into an independent standing-ring and at least a separated post. Each separated post is filled with conductive material, but not isolation layer. For the exemplary embodiment in FIG. 7, the standing-ring member is only required to be divided into an independent standing-ring and at least a separated post.

Figure 18B:
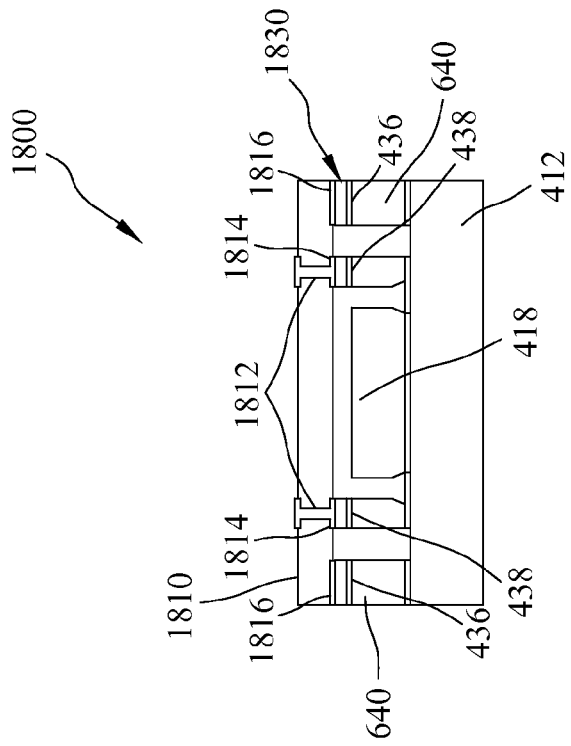
FIGS. 18A-18B show an exemplary assembly of a cover plate and a sensing device of the structure of FIG. 17D, consistent with certain disclosed embodiments.
Figure 18A:
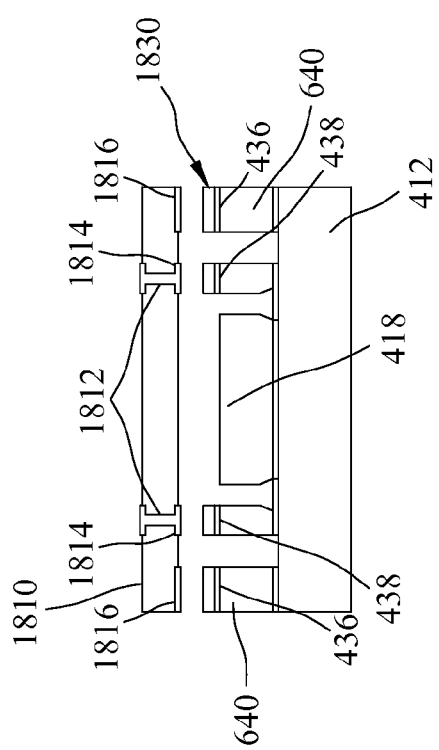

FIGS. 18A-18B show an exemplary assembly of a cover plate and a sensing device of the structure of FIG. 17D, consistent with certain disclosed embodiments. As shown in FIG. 18A, before packaging cover plate 1810 and the sensing device structure of FIG. 17D, at the sensing device structure end, signal pad 438 above separated post 750 is aligned to the signal pad 1814 above cover plate 1810 so that two wafers (i.e. sensing device and cover plate) may form signal conductive pathway when bonded. Sealing pad 436 above independent standing-ring 640 and sealing pad 1816 above cover plate 1810 are aligned before clamping the two wafers. Conductive material 1830 between the sensing device structure and cover plate 1810 may be fabricated on either the sensing device end or the cover plate end for the signal input/output between the two wafers and for sealing. Different conductive material may be used for signal input/output and sealing.

Therefore, before assembling sensing device and cover plate, cover plate wafer alignment needs to be performed so that the two wafers may align vertically. The two wafers are then clamped, and a full-wafer one-time bonding process is performed to assemble a packaged device. FIG. 18B shows an exemplary schematic view of packaged device 1800 of cover plate 1810 and sensing device of FIG. 17D, consistent with certain disclosed embodiments. As aforementioned, the location between sensing device structure and cover plate may also include signal pad 438 and sealing pad 436. The inner surface of the cover plate may include a concave area in the center area so that a gap exists between the cover plate and sensor member of the sensing device.

In summary, the disclosed exemplary embodiments provide a structure and fabrication method for a sensing device, where the standing-ring member may be either a common standing-ring structure, an independent standing-ring structure or a silicon interconnection structure. In the standing-ring structure, the conductive through-via may be formed by a TSV process, and sealing pad and signal pad may be formed by a metal bump process. An independent standing-ring and at least a separated post may be formed by an etching process. The sensing device may be fabricated by the mass wafer fabrication process, substrate wafer fabrication process and device wafer assembly. The sensing device structure and a cover plate may use a conductive material to integrate into a packaged device. The disclosed exemplary embodiments employ full-wafer one-time bonding process so as to greatly reduce the bonding time and the thickness and footprint of the overall system structure in the vertical placement.

Although the present disclosure has been described with reference to the disclosed exemplary embodiments, it will be understood that the disclosure is not limited to the details described thereof. Various substitutions and modifications have been suggested in the foregoing description, and others will occur to those of ordinary skill in the art. Therefore, all such substitutions and modifications are intended to be embraced within the scope of the invention as defined in the appended claims.

What is claimed is:

1. A structure of a sensing device, comprising:
 a substrate having an upper surface;
 a sensor member located at a center area of said upper surface of said substrate;
 a standing-ring member located on said upper surface of said substrate and surrounding said sensor member; and
 at least an external conductive wire located on said upper surface of said substrate, said standing-ring member and said sensor member being electrically connected by said at least an external conductive wire.

2. The structure as claimed in claim 1, wherein an upper surface of said standing-ring member further includes a patterned metallurgy layer on top for sealing and signal pads.

3. The structure as claimed in claim 2, wherein said standing-ring member at least includes an independent standing-ring and at least a separated post which is separate from said independent standing-ring above said substrate, each of said at least a separated post has a conductive through-via, one end of said through-via is electrically connected to said external conductive wire.

4. The structure as claimed in claim 2, wherein said standing-ring member at least includes an independent standing-ring and at least a separated post, each said separated post has one end electrically connected to said external conductive wire so as to electrically connect to said sensor member.

5. The structure as claimed in claim 2, wherein said standing-ring member at least includes at least a conductive through-via, one end of said at least a conductive through-via is electrically connected to said external conductive wire, and an isolation layer exists between said at least a conductive through-via and said standing-ring member.

6. The structure as claimed in claim 1, wherein said sensing device and a cover plate are integrated by a conductive material into a packaged device.

7. The structure as claimed in claim 6, wherein said cover plate is an application specific integrated circuit (ASIC).

8. The structure as claimed in claim 6, wherein said cover plate is a general-purpose cover plate.

9. The structure as claimed in claim 3, wherein an external outer surface of said standing-ring member further includes a sealing pad and at least a signal pad on top.

10. The structure as claimed in claim 9, wherein said at least a signal pad is distributed on the other end of said at least a conductive through-via.

11. The structure as claimed in claim 3, wherein an external outer surface of said independent standing-ring further includes a sealing pad on top, and an upper surface of each said separated post further includes a signal pad on top, said signal pad is located on top of the other end of said conductive through-via.

12. The structure as claimed in claim 4, wherein an external outer surface of said independent standing-ring further includes a sealing pad on top, and an upper surface of each said separated post further includes a signal pad on top.

13. The structure as claimed in claim 6, wherein said conductive material at least includes a sealing pad and at least a signal pad.

14. The structure as claimed in claim 1, wherein said sensor member and said standing-ring member are both silicon structures.

* * * * *